United States Patent
Azumi

(10) Patent No.: US 6,828,679 B2
(45) Date of Patent: Dec. 7, 2004

(54) SOLID IMAGE PICKUP DEVICE

(75) Inventor: Teiji Azumi, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/420,706

(22) Filed: Apr. 23, 2003

(65) Prior Publication Data

US 2003/0197173 A1 Oct. 23, 2003

(30) Foreign Application Priority Data

Apr. 23, 2002 (JP) ....................... 2002-120672

(51) Int. Cl.$^7$ ........................................ H01L 23/522
(52) U.S. Cl. ................... 257/753; 257/754; 257/763
(58) Field of Search .................. 257/753–754, 257/763

(56) References Cited

U.S. PATENT DOCUMENTS

| | | | | |
|---|---|---|---|---|
| 6,171,960 B1 | * | 1/2001 | Lee ............................. | 438/687 |
| 6,178,585 B1 | * | 1/2001 | Cadien et al. ................. | 15/230 |
| 6,184,123 B1 | * | 2/2001 | Ge et al. ..................... | 438/624 |
| 6,660,625 B2 | * | 12/2003 | Lee et al. ................... | 438/613 |
| 6,686,633 B1 | * | 2/2004 | Lage et al. .................. | 257/392 |

FOREIGN PATENT DOCUMENTS

JP          2000-196060 A          7/2000

* cited by examiner

Primary Examiner—Allan R. Wilson
(74) Attorney, Agent, or Firm—Birch, Stewart, Kolasch & Birch, LLP

(57) ABSTRACT

The invention is to provide a solid image pickup device having high electric pressure proof between charge transfer electrodes of mono-layered structure, and enabling to drive at high speed with low consumption electric power. In this invention, a silicone base is formed on a surface thereof with an insulating film, on a surface of which inter-electrode insulating films of an oxidized silicone film and charge transfer electrodes are provided. The charge transfer electrode includes an adhesion film so formed as to cover a side wall of the inter-electrode insulating film and a gate insulating film as well as a conductive film containing metals in an area surrounded with the adhesion film. The adhesion film is formed with, e.g., polycrystalline silicone of highly dense dope, while the conductive film is formed with, e.g., a tungsten layer. The charge transfer electrode is formed on the upper face with the oxidized silicone film.

12 Claims, 4 Drawing Sheets

SOLID IMAGE PICKUP DEVICE

BACKGROUND OF THE INVENTION

1. Field of the Invention

The present invention relates to a solid image pickup device and a method for producing the same, and in particular a solid image pickup device of mono-layered electrode structure and a producing method thereof.

2. Description of the Related Art

CCD solid image pickup devices used to such as area sensors have an electric charge transfer electrode for transferring signal charges from a photoelectric transferring section. A plurality of electric charge transfer electrodes is disposed on electric charge transferring paths located on a semi-conductor substrate, and each of the electric charges is arranged next to each other and driven in succession.

In the solid image pickup device, the number of imaging pixels is increasing. With increasing of the number of the imaging pixels, high-speed transfer of the signal charge, that is, drive by high-speed pulse of the charge transfer electrode is required. Therefore, the charge transfer electrode is demanded to have low resistance. As a method for producing the low resistance, it has been proposed to produce the charge transfer electrodes with two-layered structure of a silicon based conductive material such as a polycrystalline silicon and a metallic silicide.

On the other hand, an area of the photoelectric transferring section tends to become narrower with increasing the number of the imaging pixels. For concentrating much light at a narrow area, it is important to further lower height of surroundings of the photoelectric transferring section, such as charge transfer electrode producing section, with respect to the surface of the photoelectric transferring section. Therefore, the charge transfer electrode having a so-called mono-layered structure has been proposed, not overlapping the charge transfer electrodes one another. With the charge transfer electrode having the mono-layered structure, a light shielding property of a shielding film on the transfer electrode parts is improved more effectively.

However, in case the charge transfer electrode of the mono-layered structure is driven at high-speed pulse, a distance (gap) between the charge transfer electrodes arranged next to each other must be formed narrowly (0.1 μm or less). For providing pattern sizes as this degree (0.1 μm or less), a stepper of high cost is required as in a manner of using an EB direct drawing method. Moreover, even if the electrode pattern can be obtained, it is extremely difficult to fill the insulating film in a fine area between electrodes, probably causing pressure proof to be weakened, and practically insufficient.

Further, in case of that the charge transfer electrodes has the two-layered structure of the silicon based conductive material and the metallic silicide, it is difficult to oxidize metals of high melting points or metallic compounds of high melting points such as tungsten or tungsten suicide. Even if oxidation can be effected, electric pressure proof of an obtained insulating film is not sufficient. Therefore, it is impossible to form insulating films practically available caused by generating oxidation between the electrodes.

It is also proposed a two-layered structure charge transfer electrode, which has composed of the silicon based conductive material and the metallic silicide (see JP-A-2000-196060), instead of a mono-layered structure charge transfer electrode. But, only the surface of the silicon based conductive material is arranged with the metallic suicide, and the low resistance is not yet sufficient. Moreover, the distance between the electrodes of the charge transfer electrode is around 0.25 to 0.50 μm.

SUMMARY OF THE INVENTION

The invention has been built in view of the above mentioned-circumstances, and accordingly it is an object of the invention to offer such a solid image pickup device having high electric pressure proof between the charge transfer electrodes of mono-layered structure and enabling to drive at high speed with low consumption electric power, and a method of making such a solid image pickup device of simple structure and high reliability.

The present invention provides a solid image pickup device formed with a plurality of charge transfer electrodes located on an insulating film of a surface of a semiconductor substrate. The solid image pickup device has inter-electrode insulating films formed on the insulating film between the charge transfer electrodes arranged next to one another. In the solid image pickup device, the charge transfer electrodes include adhesion is films so formed as to cover side walls of the inter-electrode insulating films and the insulating film, and conductive films containing metals formed in ranges surrounded with the adhesion films.

With such a structure, the inter-electrode insulating films of fine width size can be formed. And the inter-electrode insulating films are covered closely and desirably, leaving no spaces, with the adhesion film which is so formed as to cover the side walls of the inter-electrode insulating films. Moreover, the conductive film containing the metal of low resistance is formed in the upper layer of the conductive film. For the reasons stated above, it is possible to produce electrodes having lower resistance. Further, the surface of the conductive film can be made flat. Therefore, in case a wiring structure is formed thereon, the pattern can be efficiently formed.

The present invention provides a distance of 0.1 μm or less between the charge transfer electrodes formed with the inter-electrode insulating films of the solid image pickup device. If the distance between the charge transfer electrodes is 0.1 μm or less, it is extremely difficult to fill the insulating film between the electrodes. However, since the conductive film containing the adhesion film and metals is so formed as to cover the inter-electrode insulating films, it is possible to reduce the distance between the charge transfer electrodes to be 0.1 μm or less. Accordingly, it is possible to provide the solid image pickup device of low resistance and high reliability. Therefore, the charge transfer electrodes can be driven at high pulse.

The adhesion film of the solid image pickup device of the invention is a silicon based conductive film. The polycrystalline silicon film or the amorphous silicon film can be utilized as the adhesion film. The silicon based conductive film is easy to form a film excellent in shielding stepwise differences in level depending on, for example, a pressure reducing CVD. Moreover, the silicon based conductive film also has a good adhesion with metallic layers such as tungsten. If the polycrystalline silicon film is applied as an adhesion film, it is possible to provide a further low resistance by doping.

The conductive film of the solid image pickup device of the invention is a metallic silicide film. With this structure, it is possible to provide a still further low resistance.

The conductive film of the solid image pickup device of the invention includes tungsten. With this structure, the low resistance can be provided, and at the same time, a light shielding function can be provided owing to tungsten. Therefore, it is possible to omit a shielding film conventionally demanded and obtain the solid image pickup device at low cost and of high reliability.

The inter-electrode insulating film of the solid image pickup device of the invention is a film formed by thermal oxidation of a silicon based material. As the silicon based material, a non-doped silicon may be employed.

With this structure, the silicon based material such as the polycrystalline silicon or the amorphous silicon is subjected to the thermal oxidation, thereby enabling to provide the close insulating film. In addition, using the non-doped silicon, impurities as phosphorus are prevented from contribution to conductivity, so that insulation can be made secure between electrodes. Accordingly, since the inter-electrode insulating film of high quality is formed, pressure proof can be increased.

The present invention also provides a method for producing a solid image pickup device formed with a plurality of charge transfer electrodes on a gate insulating film of a surface of a semi-conductor substrate. The method includes the steps of: forming inter-electrode insulating films for forming the gate insulating film pattern serving as the inter-electrode insulating film on the insulating film; forming an adhesion film so as to cover side walls of the inter-electrode insulating films and the gate insulating film; forming a conductive film on the upper layer of the adhesion film such that the surface of the conductive film is made flat; and performing etch-backs on the conductive film and the adhesion film until a top face of the inter-electrode insulating film is exposed.

According to this method, once passing through a photolithographic process, it is possible to form the patterns of the insulating film becoming the inter-electrode insulating film of desired reliability.

Furthermore, the step of forming the inter-electrode insulating film in the producing method of the invention includes the steps of: forming the inter-electrode insulating film on the insulating film; forming a resist pattern having a width larger in size than an objective distance between electrodes on the surface of the insulating film for forming the inter-electrode insulating film; reducing a pattern width in size by carrying out an isotropic treatment on the resist pattern; and patterning for etching the insulating film for forming the inter-electrode insulating film as a mask of the resist pattern.

According to this method, a resist pattern is formed at a resolution limit and is subjected to a further size reduction treatment, whereby the width is made fine. Therefore fine resist patterns may be easily produced, and the inter-electrode insulating film may be formed with desired reliability.

Moreover, the step of forming the inter-electrode insulating film in the producing method of the invention includes the steps of: forming a silicon based conductive film on the insulating film; forming the resist pattern having the width larger in size than the objective distance between the electrodes on the surface of the silicon based conductive film; reducing the pattern width by carrying out the isotropic treatment on the resist pattern; patterning for etching the silicon based conductive film as the mask of the resist pattern; and forming an oxidized silicon film by oxidizing the pattern of the silicon based conductive film produced by the patterning step.

According to this method, the resist pattern is formed at a resolution limit and is subjected to a further size reduction treatment, whereby the width is made fine. Therefore, fine resist patterns may be produced, and the silicon based conductive film is passed through the patterning, followed by oxidation, so that the fine patterns of the oxidized silicon film of high quality can be easily obtained.

The size reducing step of the producing method of the invention depends on an ashing step. Following this method, the resist pattern can be made fine only through the thermal treatment.

The above mentioned etch-back step of the producing method of the invention depends on a chemical machining process (CMP). According to this method, it is possible to form the solid image pickup device of good surface flatness by the CMP.

The conductive film forming step of the producing method of the invention includes a step of forming a tungsten film by a pressure reducing CVD, and at the same time, the light shielding effect may be also brought about.

In accordance with the invention, since the wiring material of low resistance is applied as the charge transfer electrodes, a device can be reduced in height size. Therefore, processing margins are broadened in the photolithographic process or the etching process. For the reasons stated above, the solid image pickup devices may be produced at high yield without using a semi-conductor producing apparatus as expensive steppers. Furthermore, since the insulating film of high quality is applied as the inter-electrode insulating films, electric pressure proof can be improved with high yield. In addition, the insulating material is not needed to be buried in ranges between the electrodes of fine width, and the electric pressure proof can be avoided from going down, and the yield can be increased.

DETAILED DESCRIPTION OF THE PREFERRED EMBODIMENTS

Explanation will be made to embodiments of the invention, referring to the attached drawings.

(First Embodiment)

Figure 1A:
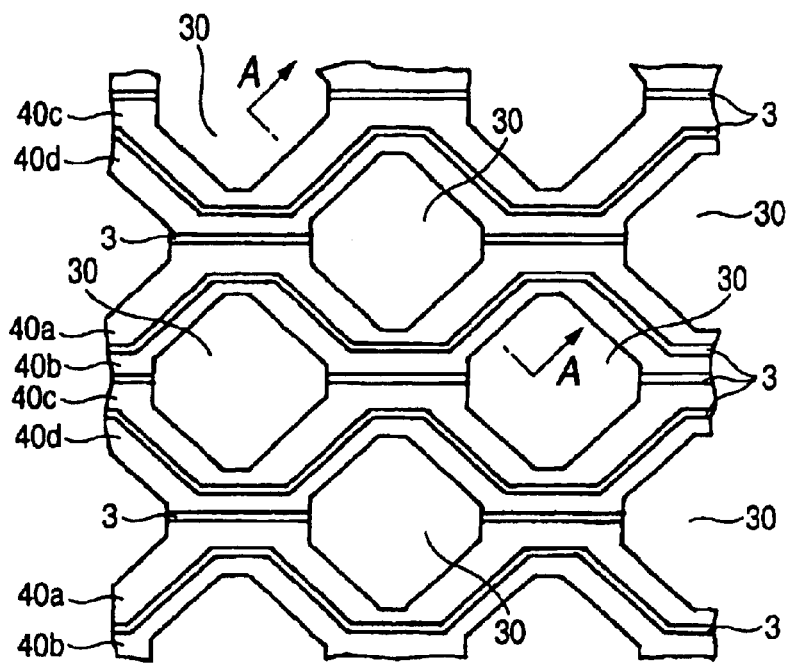
FIG. 1A is a schematic plan view showing charge transfer electrodes of the solid image pickup device of the first embodiment.
Figure 1B:
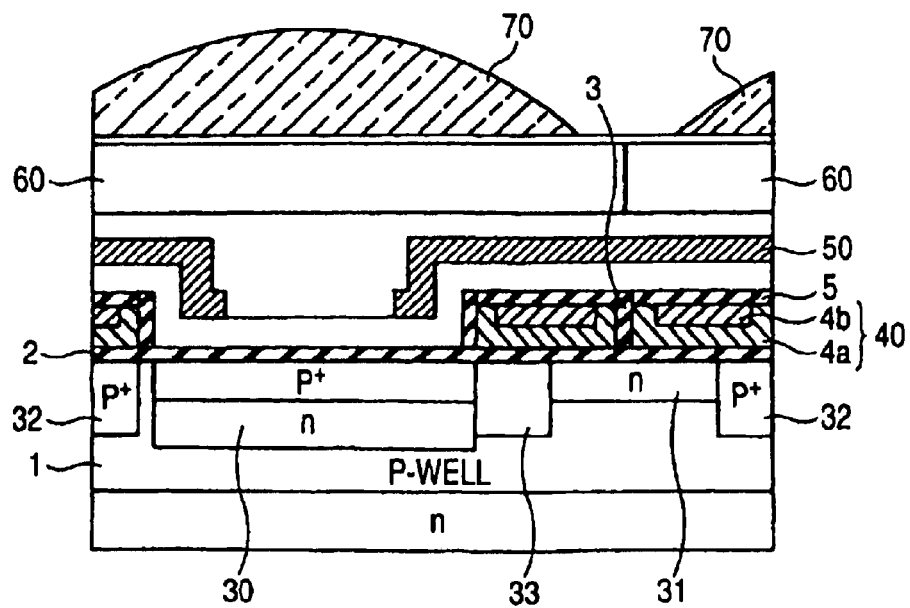
FIG. 1B is a view showing the solid image pickup device of the first embodiment seen along A—A cross section in FIG. 1A.

FIGS. 1A and 1B show schematic structures of a solid image pickup device of the first embodiment of the invention. FIG. 1A is a schematic plan view showing a charge transfer electrodes of the solid image pickup device, while FIG. 1B is a view seen along A—A cross section. As shown in FIGS. 1A and 1B, a silicon base 1 is formed with a plurality of photodiodes 30, and the charge transfer electrodes 40 (40a to 40d in FIG. 1A) for transferring signal charges detected by the photodiodes are arranged as meandering among the photodiodes 30. A charge transferring channel 31 (not shown in FIG. 1A), where the signal charge transferred by the charge transfer electrodes 40 moves, is also arranged as meandering in a direction crossing with a direction of the charge transfer electrode 40 extending. By the way, in FIG. 1A, some parts of the inter-electrode insulating films 3, which are formed in the vicinity of the photodiode area and the charge transfer electrodes 40, are omitted.

As shown in FIG. 1B, within the silicon base 1, there are provided the photodiode 30, a charge transferring channel 31, a channel stop area 32, and an electric charge readout area 33. On the surface of the silicon base 1, the insulating film 2 ("gate insulating film" hereafter) is formed. The gate insulating film 2 is formed on the surface with the inter-electrode insulating 3 composed of an oxidized silicon film and the charge transfer electrodes 40.

The charge transfer electrode 40 includes the adhesion film 4a so formed as to cover the side walls of the inter-electrode insulatings 3 and the gate insulating film 2, and the conductive film 4b containing metals in the area surrounded with the adhesion film 4a. The adhesion film 4a is formed with, e.g., polycrystalline silicon of highly dense dope. On the other hand, the conductive film 4b is formed with, e.g., a tungsten layer. The charge transfer electrode 40 is formed on the upper face with the oxidized silicon film 5.

A shielding film 50 is provided at an upper side of the solid image pickup device excepting portions over the photodiodes 30. And color filters 60 and micro lenses 70 are provided over the shielding film 50. Between the charge transfer electrodes 40 and the shielding film 50, and between the shielding film 50 and the color filters, insulating transparent resins are filled. Excepting the charge transfer electrodes 40 and the inter-electrode insulating films 3, the solid image pickup device is the same as that of the related art, and so explanation will be omitted. Incidentally, FIGS. 1A and 1B show the solid image pickup device of a so-called honeycomb structure, but of course it is applicable to the solid image pickup device of an interline type.

Next, a producing method of the solid image pickup device will be explained by use of FIGS. 2A to 2G. Steps of the producing methods other than some steps concerned with the charge transfer electrodes are the same as those conventional ones. Therefore, explanations will be omitted. In FIGS. 2A to 2G, as to a structure of an element forming area of the interior of the silicon base, a description is omitted.

Figure 2A:
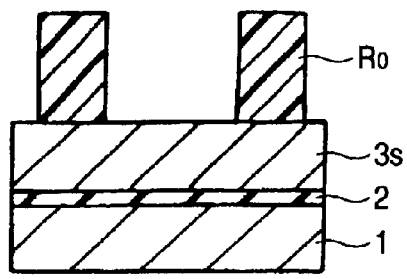
FIGS. 2A to 2G are views showing steps of producing method of the solid image pickup device of the first embodiment of the invention.

As shown in FIG. 2A, an n-typed silicon base 1, a nitride silicon film of 50 nm thickness, and an oxidized silicon film of 10 nm thickness are formed on the surface with an oxidized silicon film of 15 nm thickness so as to provide the gate insulating film 2 of a three-layered structure. Subsequently, on the gate insulating film 2, the non-doped polycrystalline silicon film 3S of 0.4 $\mu$m. thickness through the pressure reducing CVD. At this time, base temperature is 600 to 700° C., and the upper layer thereof is coated with a resist called as FDUR manufactured by TOKYO OHKA KOGYO CO., LTD. to be 0.8 to 1.4 $\mu$m in thickness.

By the photolithograph, exposure, development and water washing are carried out, using a desired mask so as to form a resist pattern R0 of 0.35 $\mu$m width. The resolution limit is then 0.35 $\mu$m.

Figure 2E:
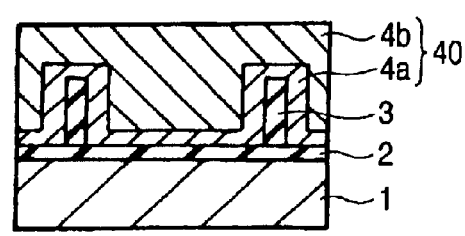
Figure 2B:
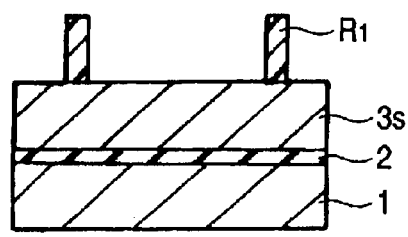

Thereafter, as shown in FIG. 2B, the resist pattern is carried out with the ashing by a microwave downstream typed ashing apparatus of adding oxygen or nitrogen to the resist pattern, and the width of resist pattern R0 is reduced to be 0.1 $\mu$m for turning out a resist pattern R1. The ashing is then performed at room temperature.

Figure 2F:
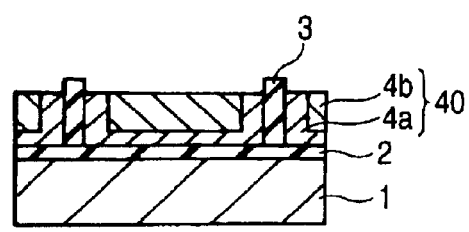
Figure 2C:
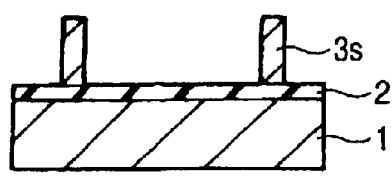

Continuously, as shown in FIG. 2C, the polycrystalline silicon film 3S is selectively etching-removed as the mask of the resist pattern R1 by reactive ion etching using a mixture of HBr and $O_2$, and then the resist pattern R1 is peeled and removed. As to individuals, it is desirable to use the etching apparatus as ECR or ICP.

Figure 2G:
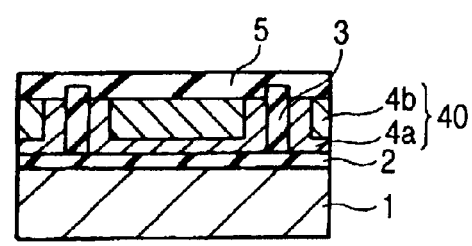
Figure 2D:
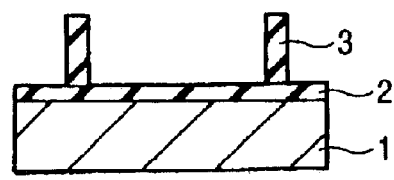

As shown in FIG. 2D, this polycrystalline silicon film 3S is performed with a pyrogenic oxidation in a HCl+$O_2$ atmosphere to produce the inter-electrode insulating film 3 and the solid image pickup device enabling high-speed actuaction.

After then, as shown in FIG. 2E, the polycrystalline silicon film 4a of 50 to 150 nm thickness is formed via the pressure reducing CVD using $SiH_4$ (He diluted). Subsequently, the tungsten film of 500 to 600 nm thickness is formed via the pressure reducing CVD using $WF_6$ and $H_2$. Temperature of the base is then 500° C. and the base has a flat surface without ruggedness.

As shown in FIG. 2F, the base surface is polished with CMP, and further subjected to the chemical etching until an upper face of the inter-electrode insulating film 3 is exposed so as to divide individually the charge transfer composed of the two films of the polycrystalline silicon film 4a and the tungsten film 4b. As shown in FIG. 2G, the upper layer of them is formed with the oxidized silicon film 5 by the pressure reducing CVD for turning out the solid image pickup device as seen in FIG. 1.

Depending on this method, once passing through the photolithographic process, it is possible to form patterns of the insulating film becoming the inter-electrode insulating film. The resist pattern of width larger in size than the distance between the electrodes has been in advance formed, and this resist pattern is carried out with an isotropic treatment by the ashing to reduce the pattern width in size, and since the resist pattern is rendered to be the mask for etching the insulating film, it is possible to form the fine inter-electrode insulating smaller than the resolution limit with good reliability.

Further, since the polycrystalline silicon film 4a is formed around the inter-electrode insulating films 3 with preferable adhesion and the tungsten film 4b is formed thereon, it is possible to provide the electrodes of very low resistance and the solid image pickup device enabling high-speed actuation.

By the way, this example has formed the inter-electrode insulating films 3 by thermal oxidation of the non-doped polycrystalline silicon film 3S, but the doped polycrystalline silicon may be employed. If using the non-doped polycrystalline silicon film 3S, an oxidized silicon film without containing impurities may be provided, so that it is possible to heighten pressure proof. But in comparison with the doped polycrystalline silicon, the non-doped polycrystalline silicon is slow in oxidizing speed and takes much time for oxidation, and in case pressure proof is not so much demanded, the doped polycrystalline silicon is used for shortening the oxidizing time.

In addition, the surface of the inter-electrode insulating film can be made flat. Therefore, when forming a wiring structure on this upper layer, the pattern can be formed efficiently.

(Second Embodiment)

A second embodiment of the invention will be explained. In the first embodiment, for forming the inter-electrode insulating films, the polycrystalline silicon film is processed to be the patterns of fine width, and then it becomes the oxidized silicon film through the thermal oxidation. On the other hand, in the second embodiment, the oxidized silicon film formed through CVD process is subjected to the patterning.

FIGS. 3A to 3H show processes explanatory views, and the processes of FIGS. 3A to 3E correspond to FIGS. 2A to 2D of the first embodiment.

Figure 3A:
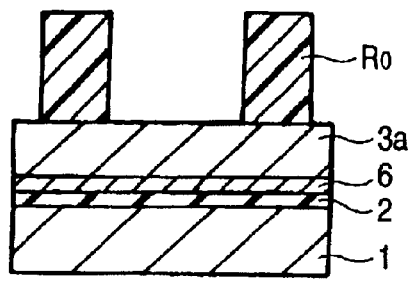
FIGS. 3A to 3H are views showing steps of producing method of the solid image pickup device of the second embodiment of the invention.

As shown in FIG. 3A, the n-typed silicon base 1 is formed on the surface with an oxidize silicon film of 15 nm thickness, a nitride silicon film of 50 nm thickness, and an oxidized silicon film of 10 nm thickness for providing the gate insulating film 2 of the three layered structure. Subsequently, on the gate insulating film 2, a polysilicon film 6 of 10 nm thickness is formed as an etching stopper, followed by forming the oxidized silicon film 3a of 0.4 $\mu$m thickness through the pressure reducing CVD. At this time, temperature of the base is 500° C., and the upper layer thereof is coated with the resist called as FDUR made by Tokyo Ohka to be 0.8 to 1.4 $\mu$m in thickness.

By the photolithograph, exposure, development and water washing are carried out by use of the desired mask so as to form a resist pattern R0 of 0.35 $\mu$m width. The resolution limit is then 0.35 $\mu$m.

Figure 3E:
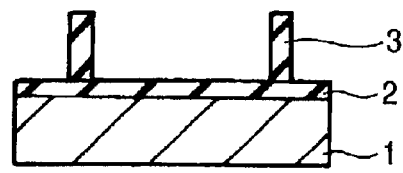
Figure 3B:
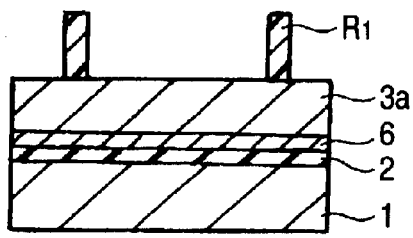

Thereafter, as shown in FIG. 3B, the resist pattern is carried out with the ashing by the microwave downstream typed ashing apparatus of adding oxygen or nitrogen to the resist pattern, and the width of the resist pattern R0 is reduced to be 0.1 $\mu$m for turning out the resist pattern R1. The ashing is then performed at room temperature.

Figure 3F:
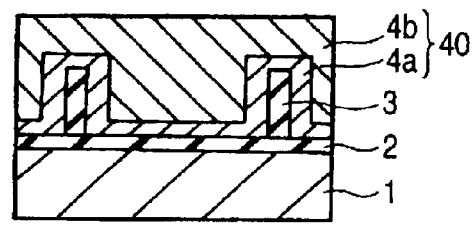
Figure 3C:
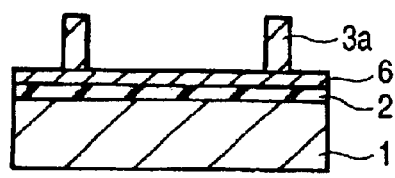

Continuously, as seen in FIG. 3C, the polycrystalline silicon film 3a is selectively etching-removed as the mask of the resist pattern R1 by reactive ion etching using a mixture of $C_4F_8$, $O_2$ and Ar. Since the polysilicon film 6 is so formed as to be the etching stopper, when the polysilicon film 6 is exposed, the etching is once finished to remove the resist pattern.

Figure 3G:
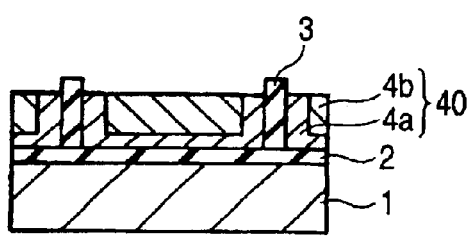
Figure 3D:
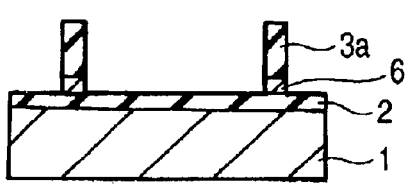

After then, as seen in FIG. 3D, since the oxidized silicon film 3a is rendered to be the mask for etching the polysilicon film 6, it is possible to avoid the surface of the gate insulating film 2 from damages caused by the etching. As shown in FIG. 3E, the polysilicon film 6 remaining at the lower parts of the oxidized silicon film 3a is thermally oxidized to make the inter-electrode insulating film 3.

Figure 3H:
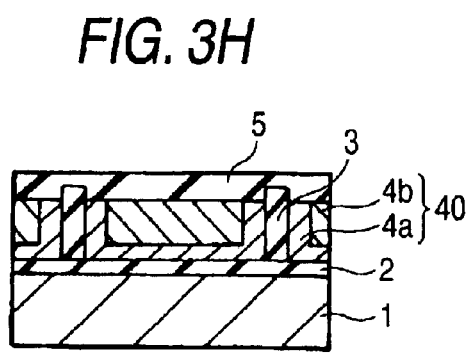

FIGS. 3F to 3H are the same as the first embodiment (FIGS. 2E to 2G), and explanation therefore will be omitted. Also following this embodiment, it is possible to form the solid image pickup device of high reliability.

(Third Embodiment)

Figure 4:
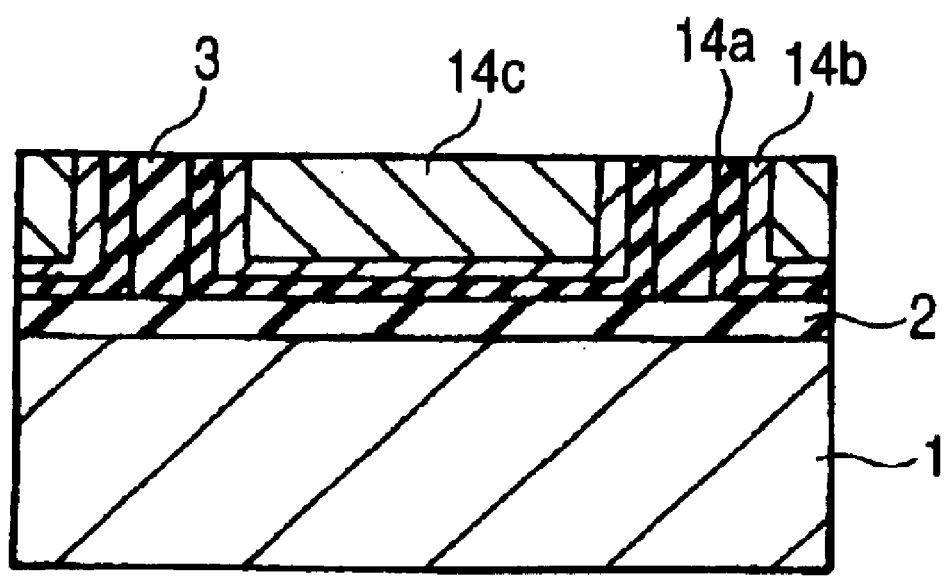
FIG. 4 is a view showing a schematic structure of the solid image pickup device of the third embodiment of the invention.

Next, a third embodiment of the invention will be explained. The first and second embodiments use the conductive polycrystalline silicon film 4a as the adhesion film, and the thin insulating film such as titanium oxide or tantalum oxide of good adhesion may be served as the adhesion film. The conductive film at this time is sufficient with one layered structure of high melting point such as molybdenum or tungsten, and multi-layered structure of titanium nitride or polycrystalline silicon+tungsten. In an example shown in FIG. 4, the adhesive insulating film 14a is composed with tantalum oxide, and the conductive film is composed with the two-layered structure of the polycrystalline silicon film 14b and the tungsten film 14c.

Using the insulating film 14a composed of tantalum oxide, it is possible to heighten pressure proof of the inter-electrode insulating as well as the adhesion.

The above mentioned embodiments employ, as the inter-electrode insulating films, the oxidized silicon film formed by oxidizing the non-doped polycrystalline silicon, but no limitation is made thereto, and the polycrystalline silicon doped in high density may be oxidized, otherwise the amorphous silicon may be served.

Further, as the adhesion film, the insulating film as the thin oxidized silicon, tantalum oxide or titanium oxide may be enough other than the polycrystalline silicon doped with impurities as phosphorus, or the amorphous silicon film.

As the conductive films 14b, 14c, tantalum, titanium, molybdenum, cobalt, or their silidices, otherwise aluminum may be adopted other than tungsten.

As having explained above, according to the invention, it is possible to provide the solid image pickup device having high electric pressure proof between the charge transfer electrodes of mono-layered structure, and enabling to drive at high speed with low consumption electric power. Further, since level of the electrode can be lowered by the low resistance of the charge transfer electrode and the surface thereof can be made flat, optical bad characteristics caused by difference as irregularity of colors can be reduced. In addition, high speed transferring is available, so that an optical characteristic as smear can be improved, and it is possible to provide CCD of high quality and high reliability.

Besides, it is possible to easily produce the solid image pickup device of high reliability having the mono-layered structure with the fine distance between electrodes.

What is claimed is:

1. A solid image pickup device comprising:
   a plurality of charge transfer electrodes formed on an insulating film of a surface of a semi-conductor substrate; and
   inter-electrode insulating films formed on the insulating film between the charge transfer electrodes neighboring one another;
   wherein said charge transfer electrodes include adhesion films so formed as to cover side walls of said inter-electrode insulating films and the insulating film, and conductive films containing metals surrounded with the adhesion films;
   wherein said semiconductor substrate comprises at least one photodiode.

2. The solid image pickup device according to claim 1, wherein a distance between the charge transfer electrodes formed with the inter-electrode insulating films is 0.1 $\mu$m or less.

3. The solid image pickup device according to claim 1, wherein the adhesion film is a silicon based conductive film.

4. The solid image pickup device according to claim 2, wherein the adhesion film is a silicon based conductive film.

5. The solid image pickup device according to claim 3, wherein the adhesion film is a polycrystalline silicon film.

6. The solid image pickup device according to claim 4, wherein the adhesion film is a polycrystalline silicon film.

7. The solid image pickup device according to claim 3, wherein the adhesion film is an amorphous silicon film.

8. The solid image pickup device according to claim 4, wherein the adhesion film is an amorphous silicon film.

9. The solid image pickup device according to claim 1, wherein the conductive film is a metallic silicide film.

10. The solid image pickup device according to claim 1, wherein the conductive film contains tungsten.

11. The solid image pickup device according to claim 1, wherein the inter-electrode insulating film is formed by thermal oxidation of a silicon based material.

12. The solid image pickup device according to claim 11, wherein the silicon based material is a non-doped silicon.

* * * * *